350-376

XR 4,117,399 SR

United States Patent [19]
Ono et al.

[11] 4,117,399
[45] Sep. 26, 1978

[54] METHOD AND APPARATUS FOR MEASURING ELECTRIC QUANTITIES BY USING LIGHT CONVERTERS

[75] Inventors: Yutaka Ono, Tokyo; Yoichi Fujii, Nagareyama; Koji Yokoyama; Toshifumi Igarashi, both of Tokyo, all of Japan

[73] Assignees: Yutaka Ono; Yoichi Fuji; Goro Eto, all of Japan

[21] Appl. No.: 782,882

[22] Filed: Mar. 30, 1977

[30] Foreign Application Priority Data

Mar. 31, 1976 [JP] Japan .................................. 51-35591

[51] Int. Cl.² .......................................... G01R 31/00
[52] U.S. Cl. ...................................... 324/96; 350/151
[58] Field of Search ...................... 324/96; 350/151; 356/117

[56] References Cited

U.S. PATENT DOCUMENTS

| 3,693,082 | 9/1972 | Jaecklin | 324/96 |
| 3,769,584 | 10/1973 | Iten et al. | 324/96 |

FOREIGN PATENT DOCUMENTS

| 1,904,554 | 8/1969 | Fed. Rep. of Germany | 324/96 |
| 2,019,934 | 11/1970 | Fed. Rep. of Germany | 324/96 |

*Primary Examiner*—Stanley T. Krawczewicz
*Attorney, Agent, or Firm*—Charles W. Helzer

[57] ABSTRACT

To a light converter including an optical effect element is applied an electric input having an amplitude exceeding the linear region of the characteristic of the light converter. The number of the peaks of the output reaching a maximum amplitude is added to the magnitude of a peak of the output not reaching the maximum amplitude thereby measuring the magnitude of the input. Two or more light converters with differential or cumulative inputs may be used.

10 Claims, 9 Drawing Figures

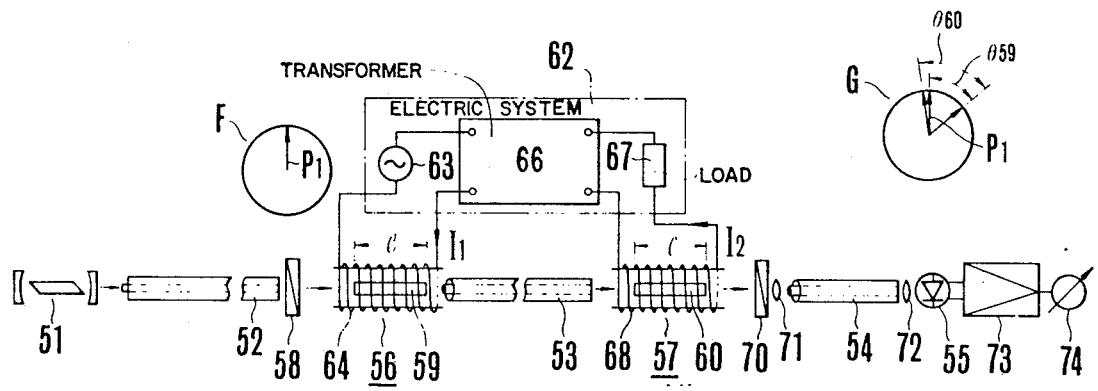

METHOD AND APPARATUS FOR MEASURING ELECTRIC QUANTITIES BY USING LIGHT CONVERTERS

BACKGROUND OF THE INVENTION

This invention relates to a method and apparatus for measuring an electric quantity by using an optical converter, and more particularly to a method and apparatus for measuring direct current, alternating current or high frequency current or voltage over a wide range by using an optical converter.

With enlargement of the scale of an electric power system, the electric power system becomes to have a large capacity and utilizes a ultra high voltage. For this reason, the information system such as protective relaying system, measuring system and operation control system can be controlled only by using electronic devices. In such a case, as a means for coupling the power system and the electronic devices and for converting the high voltage and the large current of the power system, a transformer or a capacitor has been used but there are such problems as the insulation of the interface, response speed and measuring range. Accordingly, converting apparatus have been used wherein high voltage or large current to be measured is supplied to an element manifesting an electro-optical effect or a magneto-optical effect for modulating light impinging upon a light sensitive element and detecting the variation in the quantity of the light as a measure of the high voltage or large current.

The principle of a current conversion type light converter will firstly be described with reference to FIGS. 1 and 2. The detail of this principle is described in H. Kobayashi's paper "Laser Application Technique" published on Nov. 25, 1975 by Nikkan Kogyo Shinbunsha, Tokyo.

As shown in FIG. 1, the current conversion type light converter comprises a source of laser light 11, a light pipe, for example, an optical fiber 12, a polarizer 13, a Faraday rotator comprising a solenoid coil 16 surrounding a lead glass rod 15, an analizer or polarizer 17, an optical fiber 18, a light receiver 19, an amplifier 20, an indicator 21, a focusing lens 22, and a source 23 for energizing the solenoid coil.

The coherent light emitted by the laser is converted into a linearly polarized parallel beam by the optical fiber 12 and the polarizer 13 and then enters into the Faraday rotator 14 as shown in vector diagram A where the light is rotated in polarization plane by an angle proportional to the magnetic field produced by the solenoid coil 16 by the input current I which is to be measured. The angle of rotation $\theta$ is given by the following equation $$\theta = V \int_O^l Hsds \qquad (1)$$

where V represents the verdet's constant for FG-62 lead glass: 0.098min/gauss.cm, for example, $l$ the length of the glass rod 15 or Faraday element and $H_s$ the magnetic field per unit area.

Since the magnetic field is a potential function, it can be expressed in terms of the difference in the magnetic potential U between the opposite ends of the Faraday element 15, the number of turns N of the solenoid coil N and current I as follows:

$$\theta = V \int_O^l Hsds = V \int_O^l (-\frac{\delta u}{\delta s}) ds = V\{U_{(O)} - U_{(l)}\} = VU = VIN \qquad (2)$$

The light rotated by the polarization plane passes through the analyzer 17 in proportion to the set angle thereof and then enters into the light receiver 19 through the optical fiber 18. As shown in vector diagrams A and B, when the analyzer 19 is set at an angle $\theta_0$ with respect to vector $P_l$, the output light $P_0$ is expressed as follows.

$$P_0 = P_l \cos(\theta_0 - \theta) \qquad (3)$$

Assuming now that the output of the light receiver 19 has a perfect square characteristic, the output of the light receiver $V_0$ can be expressed by the following equation $$V_0 = K\{\cos(\theta_0 - \theta)\}^2 = K/2[1 + \cos 2(\theta_0 - \theta)] \qquad (4)$$

where K represents the detector output expressed by $$K = K_D P_\gamma T (mV)$$

where
$K_D$: a detector constant (mV/mW)
$T$: detector transmission coefficient (%)
$P\gamma$: detector incident light (mW)
where
$\theta_0 = \pi/4$, equation 4 becomes $$V_0 \approx K\theta = KVNI \qquad (5)$$

meaning that a small $\theta$ manifests a linear characteristic. The error $E_R$ caused by the deviation of the curve of sin $2\theta$ from a straight line is expressed by the following equation.

$$E_R 32 (2\theta - \sin 2\theta)/2\theta \qquad (6)$$

Angle $\theta = \pi/4$ corresponds to the optimum operating point (central point) of an AC input characteristic shown in FIG. 2. At points other than this angle the linearlity is lost so that when the angle exceeds $\pi/2$, a large indication error is caused in the period. In this manner, when the width of the input $I_{IN}$ exceeds the position of $\pi/2$, a strain appears in the output $V_{out}$.

From the foregoing description, it will be noted that there is a limit on the operating range of a current converter utilizing Faraday rotation.

Furthermore, a light converter shown in FIG. 3 has also been proposed wherein Pockels effect or Kerr effect is used. The principle of this type of the light converter is described in S. Saito et al paper in I.E.E.E., QE-2 page 225, Aug. 1966. The arrangement of various optical elements is similar to that shown in FIG. 1.

In the converter shown in FIG. 3, the light emitted by a laser 31 transmits through a light transmission path including an optical fiber 32, a Pockels effect element 36 such as for example LiNbO$_3$ or quartz interposed between an orthogonally intersecting Nichols polarizer 33 and an analyzer 34, and a wavelength plate 37, and then through a focusing lens 38, and an optical fiber 39 to a light receiver 43. The Pockels effect element creates birefringence due to the voltage applied from a source 41. Accordingly, a phase difference is caused between the ordinary ray or light and the extraordinary ray or light of the linearly polarized light La thus producing an eliptically polarized light Lb. Further, the light is optically biased by the wavelength plate 37 and then enters into the analyzer 34. Only the component of the light corresponding to the set angle of the analyzer 34 passes to the light receiver 43 and then amplified by amplifier 44. The output of this amplifier is sent to an indicator 45 whereby an output voltage proportional to the voltage to be measured supplied from source 41 is indicated. The phase difference or optical retardation $\delta$ between the ordinary ray and the extraordinary ray of a transverse type Pockels effect element 36, is expressed by the following equation.

$$\delta = 2\pi l/\lambda \{(n_0 - n_e) + \frac{1}{2}(\gamma_{33}n_e^3 - \gamma 13''0^3)Ez\} \quad (7)$$

where
- $l$ : length of the element
- $\lambda$ : wavelength of light
- $n_0, n_e$ : refraction coefficient of the ordinary and extraordinary ray under zero electric field
- $\gamma_{ij}$ : electro-optical coefficient of the element
- $Ez$ : intensity of electric field applied to the element by the input voltage V of the source 41. $Ez = Vzpp/d$ where $Vzpp$ represents peak to peak AC voltage impressed upon the element.

Consequently, the output voltage $Vpp$ of the light receiver 43 is expressed by the following equation $$Vpp = 2\pi/2\lambda \, (\gamma_{33}n_e^3 - \gamma_{130}^3)K_T K_P I_0 \cdot l/d \cdot Vzpp \quad (8)$$

where
- $d$ : thickness of the Pockels element
- $l$ : length of the Pockels element
- $I_0$ : light input
- $K_p$ : transmittivity In a Z bar type Pockels effect element, $\delta$ and $Vpp$ are expressed by the following equations:

$$\delta = 2\pi l/\lambda \, \gamma_{22}n_0^3 \, Ex \quad (9)$$

$$Vpp = \pi/\lambda \cdot \gamma_{22}n_0^3 K_T K_P I_0 \cdot l/d \cdot V_{xpp} \quad (10)$$

where
- $Ex$ : intensity of the electric field applied to the element by the input voltage V from source 41. $Ex = Vxpp/d$.
- $Vxpp$ : peak to peak AC voltage impressed upon the element.

The input/output characteristic of the light converter of the type shown in FIG. 3 is shown by a curve L shown in FIG. 4. The range in which the amplitude of the output light $V_{out}$ corresponding to an input $V_{in}$ is the range in which the phase difference $\delta$ between the ordinary ray and the extraordinary ray is smaller than $\pi$ (that is, the range in which the amplitude of the input $V_{in}$ is smaller than $V_\pi$) as can be noted from the characteristic curve. The voltage at the upper limit $\delta = \pi$ is termed a "half wavelength voltage $V_\pi$".

For this reason, the conventional light converter of the type shown in FIG. 3 has generally been used in a thick line range $l$ shown in FIG. 3 for detecting the amplitude of the output light. Since the voltage $V_{in}$ of the source 41 applied to the element 36 is set at the central operation point $\pi/2$, when the amplitude of the impressed voltage $V_{in}$ is larger than the half wavelength voltage $V_\pi$, due to nonlinearity of the characteristic L shown in FIG. 4, the output is limited thus disenabling the measurement. More particularly, when the amplitude of the input $V_{in}$ increases beyond the range indicated by the thick line $l$, the output $V_{out}$ is greatly distorted due to the non-linearity of the characteristic giving an unreliable measurement value.

As has been discussed hereinabove the voltage and/or current measuring range of the prior art light converters is limited to the linear range of the characteristics shown in FIGS. 2 and 4. Although it is possible to make the voltage or current to be measured to always coincide with the linear region by changing the tap of a transformer in combination with resistors or capacitors where the value of the voltage or current to be measured can be expected, such method is not only troublesome but also impossible to measure such abnormal voltage or current caused by a short circuit or lightening.

SUMMARY OF THE INVENTION

It is a principal object of this invention to provide an improved method and apparatus capable of increasing the measuring range of current or voltage, and accurately measuring the maximum value of the current or voltage under normal and abnormal conditions of the power system using a light converting type measuring apparatus while efficiently protecting and or interrupting the power system.

Another object of this invention is to provide an electric quantity measuring apparatus of the light converter type of high accuracy that can digitally detect the current or voltage.

According to one aspect of this invention, there is provided a method of measuring an electric quantity comprising the steps of applying an electric input to a light converter including an optical effect element having a characteristic in which the output varies periodically with an increase in the input, said input having an amplitude exceeding a linear range of the characteristic, and adding the number of the peaks of the output which reach a predetermined maximum amplitude to the magnitude of a peak of the output not reaching the maximum amplitude thereby measuring the magnitude of the input.

According to another aspect of this invention, there is provided apparatus for measuring an electric quantity comprising a light converter including an optical effect element having a characteristic in which the output varies periodically with an increase in an electric input, means for applying an electric input having an amplitude exceeding a linear range of the characteristic to the light converter, counting means for counting the number of the peaks of the output which reach a predetermined maximum amplitude, detecting means for detecting the magnitude of a peak of the output not reaching the maximum amplitude, an adder for adding the outputs of the counting means and the detecting means, and display means for displaying the output of the adder.

The optical element in practicing the invention may be a magneto-optical effect element such as a Faraday effect element or an electro-optical effect element such as Pockels effect element and a Kerr effect elemnt.

BRIEF DESCRIPTION OF THE DRAWINGS

Further objects and advantages of the invention can be more fully understood from the following detailed description taken in conjunction with the accompanying drawings in which:

FIG. 1 is a diagramatic representation of a prior art measuring apparatus utilizing a current conversion type light converter;

FIG. 2 is a graph showing the input current-output voltage characteristic of the apparatus shown in FIG. 1;

FIG. 3 is a diagrammatic representation of a prior art measuring apparatus utilizing a voltage conversion type light converter;

FIG. 4 is a graph showing the input current-output voltage characteristic of the apparatus shown in FIG. 3;

FIG. 5 is a diagrammatic representation of one embodiment of the measuring apparatus according to the invention utilizing a current conversion type light converter;

FIG. 6 is a graph showing the current-Faraday rotation angle characteristic useful to explain the operation of the apparatus shown in FIG. 5;

FIG. 7 is a diagrammatic representation of a modified embodiment of this invention utilizing a voltage conversion type light converter;

FIG. 8 is a graph useful to explain the method of measuring an electric quantity by the apparatus shown in FIGS. 5 and 7; and FIG. 9 is a block diagram showing one example of suitable signal processing circuitry for the measuring apparatus of this invention.

DESCRIPTION OF THE PREFERRED EMBODIMENTS

Referring now to FIGS. 5 to 8, the principle of the combination of a plurality of light converters for effecting differential operation will be described.

The apparatus shown in FIG. 5 utilizes an optical system identical to those shown in FIG. 1 that is comprising a laser 51, optical fibers 52, 53 and 54 and a light receiver 55 but is different from that shown in FIG. 1 in the following points. In this case a current conversion type light converter is used. More particularly, the Faraday rotator is constituted by two parts 56 and 57. Accordingly, the coherent light produced by the laser 51 and transmitted through the optical fiber 52 is linearly polarized by the polarizer 58 as shown by a vector diagram F and a parallel polarized beam produced thereby transmitted through Faraday elements 59 and 60 in series. The current passed through the solenoid coil 64 of the Faraday rotator 56 by a source 63 of an electric system 62 is denoted by $I_1$, and the current through the solenoid coil 68 of the second Faraday rotator 57 from a network 66 which may be a substation or a transformer through a load 67 is denoted by $I_2$. Since the directions of currents $I_1$ and $I_2$ are opposite, their difference appears as a resultant. Accordingly, if currents $I_1$ and $I_2$ are depicted by solid lines, their difference is smaller than $I_1$ or $I_2$ as shown by dot and dash lines in FIG. 6.

As shown by a vector diagram G, when expressed by the angle of rotations of the polarization planes of the Faraday elements 59 and 60 contained in respective Faraday rotators 56 and 57, the parallel light beam $P_f$ shown in the vector diagram F is rotated again by angle $\theta_{59}$ in the clockwise direction by the Faraday element 59 in the Faraday rotator. When the output light from the Faraday rotator 56 is transmitted to the Faraday rotator 57 via the optical fiber 53 in a mono-mode state, the incident light will be rotated again by angle $\theta_{60}$ in the counterclockwise direction by the Faraday element 60 since the direction of current $I_2$ flowing through the solenoid coil 68 is opposite to that of the current $I_1$ flowing through the solenoid coil 64 as has been pointed out hereinabove. Since the values of currents $I_1$ and $I_2$ are substantially equal, angles $\theta_{59}$ and $\theta_{60}$ are substantially equal. For this reason, the output light from the Faraday rotator 57 is polarized in such extent that it is rotated slightly with respect to the incident light to the Faraday rotator 56.

The output light from the Faraday rotator 57 is received by a light receiver 55 via an analyzer or polarizer 70, a condenser lens 71, an optical fiber 54 and a lens 72 and the output of 55 indicated by an indicator 74 via an amplifier 73. The light incident upon the light receiver 55 is expressed by equation 3 while the output from the light receiver 55 is expressed by equation 4. These values vary depending upon the position of the analyzer 70, and the bias condition of the light receiver, and are adjusted to control the voltages sufficient to operate the indicator 74.

From the foregoing description, it will be clear that even when inputs to the Faraday rotators 56 and 57 increase greatly or when either one of the inputs becomes minimum, a desired relationship still exists between inputs both on the outside of the linearly varying range or between an input which varies linearly and an input which varies nonlinearly. This will be clarified by equation 12 to be described later. For example, where the current during night time amounts to 50A, a current of the order of 50,000A flows when a short circuit occurs. The apparatus of this invention can readily measure such fault current.

FIG. 7 shows a modified embodiment of this invention which is substantially identical to that shown in FIG. 3 but in this case, two differentially connected Pockels effect elements 81 and 82 are used. However, Kerr effect elements can also be used. In FIG. 7, elements 81 and 82 comprise the transverse type Pockels element described above. The coherent light emitted by a laser 84 is transmitted to the Pockels effect element 81 via an optical fiber 83 and an orthogonally intersecting polarizer 86. The light transmitting through the Pockels effect element 81 is transmitted to the other Pockels effect element 82 through an optical fiber 88 and then transmitted to a light receiver 94 through an analyzer 90, a lens 91 and an optical fiber 92. The output from the light receiver 94 is applied to an indicator 96 via an amplifier 95. The apparatus shown in FIG. 7 is used to measure a high voltage through a Boucherot capacitor type transformer 100 connected to a power line.

As is well known in the art, transformer device 100 comprises a resonance circuit (tuned to a commercial frequency) constituted by serially connected capacitors 101, 102, 103 and 104, an inductor 105 and a transformer 106 and the output is derived from across secondary terminals U and V as a load output.

Consider now the measurement of odd higher harmonics (third, fifth, seventh . . . ) of 50 or 60Hz of the power system or a surge voltage such as radio frequency wave.

A voltage of a higher harmonic or radio frequency is reduced to a voltage Vc optimum for the measuring apparatus by the capacitors 101–103 serially connected between the power line and the ground. However, the phase of the output voltage Vc is disturbed by the current $i_e$ flowing through the resonance inductor 105. To obviate this difficulty, a capacitor 104 is connected in parallel with inductor 105 and the voltage $V_0$ provided by this parallel combination is differentially combined with the divided voltage Vc thus eliminating the phase error.

Thus, the divided voltage Vc produced by the capacitance potentiometer is applied to the Pockels effect element 81 whereas to the Pockels effect element 82 is applied the differential combination of voltages Vc and $V_0$. Consequently, the phase variation and voltage variation caused by the magnitude of the burden of the transformer device 100 cancel with each other. As shown by vector diagrams H and K, by arranging the voltage application planes of the Pockels effect elements 81 and 82 to form a Y bar for transmitting the light, temperatue compensation can also be made.

As will be discussed later with reference to FIG. 8, according to this invention it is possible to have accurate measurement even when the phase difference or optical retardation δ of the Pockels effect element is caused to vary linearly or nonlinearly due to a large variation in the normal and abnormal line voltage. Also as has been described above, error can be compensated for by the internal operation processing of a single optical system by differentially combining two voltage conversion type light converters.

The digital measurement of the amplitude of an electric quantity which varies linearly or nonlinearly will now be described with reference to FIG. 8.

The phase difference δ between the normal light and the abnormal light produced by a Pockels effect element is generally expressed by the following equation:

$$\delta = \pi \cdot Vm/V_\pi \qquad (11)$$

where

Vm : the maximum value of the impressed voltage $V_{90}$: a voltage determined by the electro-optical constant refractive index, shape of the element and the wavelength of the laser light.

In the construction shown in FIG. 7, when a voltage $V_{in}$ proportional to the voltage Vm sin ωt of the power line 100 is impressed upon the elements 81 and 82, the output voltage $V_{out}$ is shown by an equation $$V_{out} = K \sin \delta = K \sin(\pi \cdot Vm/V_\pi \cdot \sin \omega t) \qquad (12)$$

where K is a constant.

As shown in FIG. 8, when input voltages $V_1$ and $V_2$ not following the linear line (thick line l) of the characteristic curve L are impressed, output voltages $V_{11}$ and $V_{21}$ are produced. When a voltage $V_3$ within this range is impressed, an output voltage $V_{31}$ is produced.

Denoting the number of peaks M at which the waveforms $V_{11}$ and $V_{21}$ reach the maximum amplitude in one period by n, and the distance between a peak not reaching the maximum amplitude and the center line by $V_0$ ($V_{01}$, $V_{02}$) (provided that the case in which the peak crosses the central line is taken as positive, whereas, the case wherein the peak does not reach the central line is taken as negative), then the impressed voltage Vm ($Vm_1$, $Vm_2$) is expressed by the following equation:

$$Vm = n/4 \cdot V_\pi + V_\pi/\pi \cdot \sin^{-1} V_0/K = V_\pi (n/4 + 1/\pi \cdot \sin^{-1} V_0/K) \qquad (13).$$

As can be noted from this equation, by reading the waveforms $V_{11}$ and $V_{21}$ by detecting n and $V_0$, even high voltages $V_1$ and $V_2$ on the outside of the linear range (l) can be accurately measured.

A specific device utilized to measure voltage by the method described above will be described with reference to FIG. 9. There is provided a current or voltage conversion type light converter 110 which produces an electrical output proportional to the modulated light through a magnet or electric-photo effect element as shown in FIGS. 2 and 4. There are also provided a full wave rectifier 111, a counter 112, a peak voltmeter 114, an analogue-digital converter 115, an adder 116 for adding the outputs of the counter 112 and the converter 115, and a digital display device 117.

With the construction shown in FIG. 9, when either a small voltage $V_3$ or a large voltage $V_1$ (or $V_2$) is impressed, the light converter 110 produces an electric output shown by $V_{11}$ and $V_{21}$ shown in FIG. 8 and this output is rectified by the full wave rectifier 111. The number of peaks n that have reached a maximum value is counted by counter 112 and the count thereof is applied to adder 116. This means that the most significant digit can be recognized immediately. The amplitudes $V_{01}$ and $V_{02}$ of the peaks of the output that have not reached the maximum amplitude are measured by the peak voltmeter 114 and the measured values are converted into digital quantities by the anologue-digital converter 105 and then applied to the adder 116. Thus, the adder adds the two inputs according to equation 13 and the sum is displayed by the display device 117 as a digital quantity. Accordingly, it is possible to judge at once whether there is an abnormal condition or not thus assuring possible protection.

Although in the foregoing embodiments voltage was measured, when a current conversion type light converter shown in FIG. 1 is substituted for the light converter shown in FIG. 9, the measurement of current is possible.

A laser can be substituted by a luminous diode or any light source emitting noncoherent light in which case the same function can also be provided by suitably selecting the polarizer or the crystalline axis of the photo-effect element.

While, in those embodiments, there are provided differentially connected two light converters, they may be connected cumulatively. Further, it is possible to modify these embodiments such that a single light converter may be used.

Further in this embodiment, the invention was applied to an input lying in a region outside of the linear region of the characteristic curve, it should be understood that the invention is also applicable to an input in the linear range.

As above described, according to this invention, the number of the peaks that reaches a maximum amplitude is added to the peak not reaching the maximum amplitude so that it is possible to accurately measure voltage or current.

What is claimed is:

1. A method of measuring an electric quantity comprising the steps of applying an electric input to be measured to an electro-optic light converter including an optical effect element having a characteristic with a linear range in which an output electric signal is produced by said light converter which varies with changes in said electric input to be measured, said electric input to be measured having an amplitude exceeding the linear range of said characteristic, adding the number of the peaks of the output electric signal which reaches a predetermined maximum amplitude to the magnitude of peaks of the output electric signal not reaching said maximum amplitude, and deriving an indication of the sum thereof as a measure of the magnitude of said input electric quantity.

2. The method according to claim 1 wherein said optical effect element comprises a Faraday effect element.

3. The method according to claim 1 wherein said optical effect element comprises a Pockels effect element.

4. The method according to claim 1 wherein said optical effect element comprises Kerr effect element.

5. The method according to claim 1 wherein at least two optical effect elements are supplied with different electrical inputs to be measured and the difference in the outputs of said two optical effect elements is used to measure the input electric quantity.

6. Apparatus for measuring an electric quantity comprising an electro-optic light converter including an optical effect element having a characteristic with a linear range in which an output electric signal is produced by said light converter which varies with changes in an electric input to be measured by the apparatus, means for applying an electric input to be measured having an amplitude exceeding the linear range of said characteristic to said apparatus, counting means for counting the number of the peaks of the output electric signal which reaches a predetermined maximum amplitude, detecting means for detecting the magnitude of peaks of the output electric signal not reaching said maximum amplitude, adder means for adding the outputs of said counting means and said detecting means, and display means for displaying the output of said adder means.

7. Apparatus according to claim 6 wherein said electro-optic light converter includes at least two optical effect elements supplied with different electric inputs to be measured and the difference in the outputs of the two optical effect elements is used to derive the output electric signal supplied to said counting means and said detecting means.

8. Apparatus according to claim 7 wherein the optical effect elements comprise Faraday effect elements.

9. Apparatus according to claim 7 wherein the optical effect elements comprise Pockels effect elements.

10. Apparatus according to claim 7 wherein the optical effect elements comprise Kerr effect elements.

* * * * *